(12) United States Patent
Nakamura

(10) Patent No.: US 7,116,395 B2
(45) Date of Patent: Oct. 3, 2006

(54) LIQUID IMMERSION TYPE EXPOSURE APPARATUS

(75) Inventor: Takashi Nakamura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 13 days.

(21) Appl. No.: 10/877,315

(22) Filed: Jun. 24, 2004

(65) Prior Publication Data
US 2005/0030497 A1   Feb. 10, 2005

(30) Foreign Application Priority Data
Jun. 25, 2003   (JP)   ............... 2003/181261

(51) Int. Cl.
*G03B 27/52* (2006.01)
*G03B 27/42* (2006.01)
(52) U.S. Cl. .......................... 355/30; 355/53
(58) Field of Classification Search .......... 355/30, 355/53–67; 250/548
See application file for complete search history.

(56) References Cited

U.S. PATENT DOCUMENTS

| | | | | |
|---|---|---|---|---|
| 5,610,683 A | * | 3/1997 | Takahashi | ................... 355/53 |
| 5,825,043 A | * | 10/1998 | Suwa | ........................ 250/548 |
| 2004/0103950 A1 | * | 6/2004 | Iriguchi | ......................... 141/2 |
| 2005/0132914 A1 | * | 6/2005 | Mulkens et al. | ......... 101/463.1 |
| 2005/0134817 A1 | | 6/2005 | Nakamura | |

FOREIGN PATENT DOCUMENTS

| | | |
|---|---|---|
| JP | 57-153433 | 9/1982 |
| JP | 06-124873 | 5/1994 |
| WO | WO99/49504 | 9/1999 |

* cited by examiner

*Primary Examiner*—Henry Hung Nguyen
(74) *Attorney, Agent, or Firm*—Morgan, Finnegan, LLP

(57) ABSTRACT

Disclosed is a liquid immersion type exposure apparatus specifically arranged to maintain a liquid film between an exposure substrate and a terminal end portion of a projection optical system. In one preferred form, the liquid immersion type exposure apparatus includes a projection optical system for projecting a pattern of a mask onto a substrate, a liquid film forming system for forming a liquid film in a predetermined region between the projection optical system and the substrate, and a sensor for detecting disappearance of at least a portion of the liquid film in the predetermined region.

7 Claims, 7 Drawing Sheets

LIQUID IMMERSION TYPE EXPOSURE APPARATUS

FIELD OF THE INVENTION AND RELATED ART

This invention relates generally to a projection exposure apparatus to be used in a lithographic process for manufacture of devices such as semiconductor integrated circuit, image pickup device (e.g. CCD), liquid crystal display device, or thin-film magnetic head, for example. More particularly, the invention concerns a liquid immersion type exposure apparatus in which exposure is carried out through a liquid medium placed at least in a portion of a light path between a projection optical system and a substrate to be exposed.

The exposure wavelength has been made shorter and shorter to meet improvements in the required resolution of exposure apparatuses. Since such shortening of the exposure wavelength leads to difficulties in developing and producing lens materials which are transparent with respect to that wavelength, it raises the cost of the projection optical system. Therefore, recent exposure apparatuses are becoming expensive.

In consideration of these inconveniences, liquid immersion type exposure apparatuses have been proposed as an exposure apparatus in which, while using a similar projection exposure system as used conventionally, the wavelength of light upon the surface of a substrate to be exposed is substantially shortened to thereby increase the resolution.

In such liquid immersion type exposure apparatus, at least a portion between a substrate and a free end portion of an optical element of a projection optical system, closest to the substrate, that is, the trailing end portion of the projection optical system, is filled with a liquid medium. Where the liquid medium has a refractive index N, the wavelength of exposure light within the liquid medium is 1/N of that within the air. Therefore, it is possible to increase the resolution without changing the structure of a conventional exposure apparatus largely.

For example, Japanese Laid-Open Patent Application No.57-153433 proposes an apparatus having a structure that a liquid is discharged from a nozzle provided near a free end of a lens to assure that the liquid is kept only between the lens and an exposure substrate.

Also, Published International Application No. WO 99/49504 shows a liquid immersion type exposure apparatus in which, when a substrate is moved in a predetermined direction, a predetermined liquid is caused to flow along the movement direction of the substrate so as to assure that the liquid fills the space between the surface of the substrate and a free end of an optical element of a projection optical system, facing to the substrate side.

Furthermore, Japanese Laid-Open Patent Application No. 6-124873 proposes an apparatus of the structure that the exposure substrate as a whole is immersed in a liquid.

In a liquid immersion exposure apparatus of the type that a liquid is held only between an exposure substrate and a termination end portion of a projection optical system, in order to assure exposure with a predetermined precision, it is inevitable to maintain a liquid film formed between the exposure substrate and the projection optical system termination end portion.

In the semiconductor manufacture, step-and-scan type exposure apparatuses for performing exposure while scanning a mask and a wafer synchronously are used prevalently. Where a liquid immersion exposure apparatus is structured as a step-and-scan type, since the exposure substrate is moved all the time during the exposure, it is difficult to maintain the liquid film, and disappearance of even a portion of the liquid film directly leads to exposure failure. It is therefore desirable to maintain the liquid film appropriately.

SUMMARY OF THE INVENTION

It is accordingly an object of the present invention to provide an exposure apparatus by which a liquid film can be maintained appropriately between an exposure substrate and a termination end portion of a projection optical system.

It is another object of the present invention to provide a high-performance device manufacturing method using such exposure apparatus.

In accordance with an aspect of the present invention, there is provided a liquid immersion type exposure apparatus, comprising: a projection optical system for projecting a pattern of a mask onto a substrate; a liquid film forming system for forming a liquid film in a predetermined region between said projection optical system and the substrate; and a sensor for detecting disappearance of at least a portion of the liquid film in said predetermined region.

In one preferred from of this aspect of the present invention, the apparatus further comprises a controller for estimating the position where the disappearance of liquid film has occurred, on the basis of the detection by said sensor.

The controller may have a function for discriminating whether exposures having been made to shot regions of the substrate are effective or not, on the basis of the result of estimation.

The controller may have a function for performing a process for recovering the liquid film, on the basis of the result of estimation.

At least a portion of said sensor may be disposed in a region being filled with the liquid film. The predetermined region may include an exposure region of the substrate.

In accordance with another aspect of the present invention, there is provided a device manufacturing method, comprising the steps of: exposing a substrate by use of an exposure apparatus as recited above; and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 1:
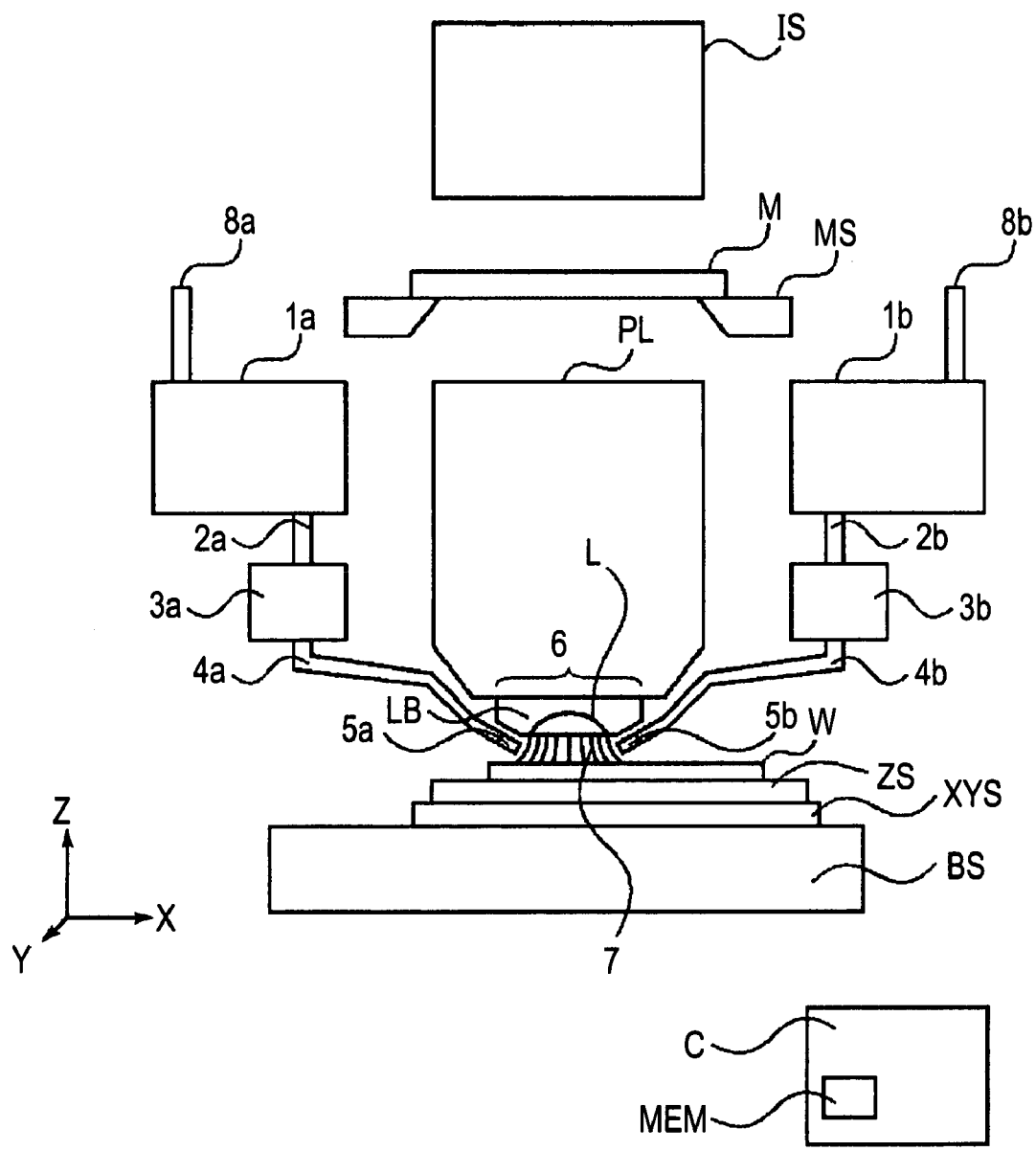
FIG. 1 is a schematic view of a general structure of a liquid immersion type exposure apparatus according to an embodiment of the present invention.

FIG. 1 illustrates a general structure of a liquid immersion type exposure apparatus according to an embodiment of the present invention. A longitudinal direction (Z direction) in the drawing corresponds to a vertical (gravity) direction.

For overview of the apparatus, the operation thereof excluding that of liquid film detecting means will be explained first.

Exposure light from an illumination device IS illuminates a mask or reticle M (which is an original), and a pattern of the mask M is transferred, while being reduced, by a projection optical system PL to a wafer (or a glass plate, for example) W (which is a photosensitive substrate), being coated with a resist. The illumination device IS comprises a light source (e.g. ArF excimer laser having a wavelength of about 193 nm or KrF excimer laser having a wavelength of about 248 nm), and an illumination system for illuminating the mask with light from such light source.

A mask stage MS functions to adjust the position of the mask M. A termination end portion 6 is a part of a projection optical system PL, and it may be a lens (optical element), for example. The termination end portion is a component of the projection optical system, which is disposed closest to the wafer. The bottom surface of the projection optical system termination portion 6, that is, the surface disposed opposed to the wafer W, is a flat surface. The position of the wafer W with respect to horizontal directions is adjusted by means of an X-Y stage XYS, and the position thereof with respect to vertical directions is adjusted by means of a Z stage ZS. The Z stage ZS is mounted on the X-Y stage XYS. Denoted at BS is a precision base table that supports the X-Y stage XYS.

In this example, a final lens L is a convex lens. However, the projection optical system may include a plane glass having almost no optical power.

There is sensor means disposed along the bottom face of the projection optical system termination end portion 6, for detecting a liquid film. Details of it will be described later.

Denoted at 1a is a liquid supplying and collecting system which receives the supply of pure water from a water supply pipe 8a. The liquid supplying and collecting system is connected to a filter system 3a through a joint pipe 2a. The water supply pipe 8a is connected to a pure water producing equipment, not shown. The filter 3a functions to remove impurities in the liquid medium. A liquid supplying and collecting pipe 4a is connected to the filter 3a. There is a nozzle 5a formed at a tip end of the liquid supplying and collecting pipe 4a. The tip end of the nozzle 5a is disposed close to the bottom surface edge of the termination end portion 6 of the projection exposure system.

The liquid medium discharged from the nozzle 5a fills the space between the wafer W and the projection optical system termination end portion 6, and a liquid film 7 is formed there. The nozzle 5a can operate as required to suck up the liquid medium that forms the liquid film 7. The liquid discharging and the liquid suction described above are controlled through the liquid supplying and collecting system 1a.

The liquid film 7 should transmit the exposure light without absorption. Also, it should not abrade a resist material applied to the wafer W. For these reasons, pure water is used as the liquid medium for forming the liquid film 7.

The exposure apparatus further comprises a liquid supplying and collecting system 1b, a joint pipe 2b, a filter system 3b, a liquid supplying and collecting pipe 4b, a nozzle 5b and a water supply pipe 8b, all of which have a similar function as of the liquid supplying and collecting system 1a, the joint pipe 2a, the filter system 3a, the liquid supplying and collecting pipe 4a, the nozzle 5a and the water supply pipe 8a, respectively. The tip end of the nozzle 5b is disposed at a side of the projection optical system termination end portion 6, remote from the nozzle 5a.

In FIG. 1, when the wafer W is moved rightwardly, the liquid supplying and collecting system 1a expels a liquid medium reserved therein, by use of a pump. The liquid medium is supplied to the filter 3a through the joint pipe 2a and, after impurities are removed there, the liquid medium is supplied to the liquid supplying and collecting pipe 4a. The liquid medium is then discharged from the nozzle 5a onto the wafer W, such that the liquid film 7 is held there. On the other hand, following the motion of the wafer W, the right-hand side end portion of the liquid film 7 is undesirably going to be dislocated off the bottom face area of the tip end portion 6 of the projection optical system. However, this can be prevented by sucking the liquid medium by use of the nozzle 5b. The liquid medium thus sucked through the nozzle 5b is sent to the filter 3b via the liquid supplying and collecting pipe 4b, whereby impurities there is are removed. The liquid medium is then reserved into the liquid supplying and collecting system 1b through the join pipe 2b.

In FIG. 1, when the wafer W is moved leftwardly, the above-described operations are carried out inversely (in the sense of right and left).

If the wafer W is moved reciprocally in leftward and rightward directions at a short cycle, the nozzles 5a and 5b repeatedly perform liquid suction operation and liquid discharging operation. In that occasion, there is a possibility that the sucked liquid medium is discharged again without reaching the filter system (3a or 3b). Although this is not preferable, it does not raise a critical problem if the time the liquid contacts the atmosphere is very short.

In FIG. 1, the nozzles 5a and 5b are illustrated as being spaced apart from the termination end portion 6 of the projection optical system. However, it is considered that the liquid film 7 should have a thickness of about 0.1 mm, in order to obtain a good exposure precision. For this reason, practically, the nozzles 5a and 5b have to be placed very close to the bottom face edge of the projection optical system termination end portion 6. To this end, as an example, the nozzles 5a and 5b may be embedded inside a barrel of the projection optical system termination end portion 6.

FIG. 1 is a section taken along one direction, and only two nozzles 5a and 5b are illustrated there. Actually, however, since the wafer W moves in various directions along the X-Y plane, in order to meet these motions to maintain the liquid film, it is desirable to provide additional nozzles around the outer periphery of the projection optical system termination end portion 6.

The cooperative functions of the components described above are controlled by a controller C. The controller C comprises a microprocessor (not shown) and a memory MEM, for example. It is connected to a control system inside the exposure apparatus thorough unshown communication means, and also it is connected to a host computer that generally controls the production line, through unshown communication means. Although in this embodiment the controller C is provided outside the exposure apparatus, it may be provided inside the exposure apparatus.

The foregoing is the description concerning the structure and function of the exposure apparatus, except the liquid film (liquid medium) detecting means.

Now, detection of disappearance of a liquid film (liquid medium) through the liquid film (liquid medium) detecting means as well as estimation of disappearance position of the liquid film (liquid medium) will be described.

Figure 2:
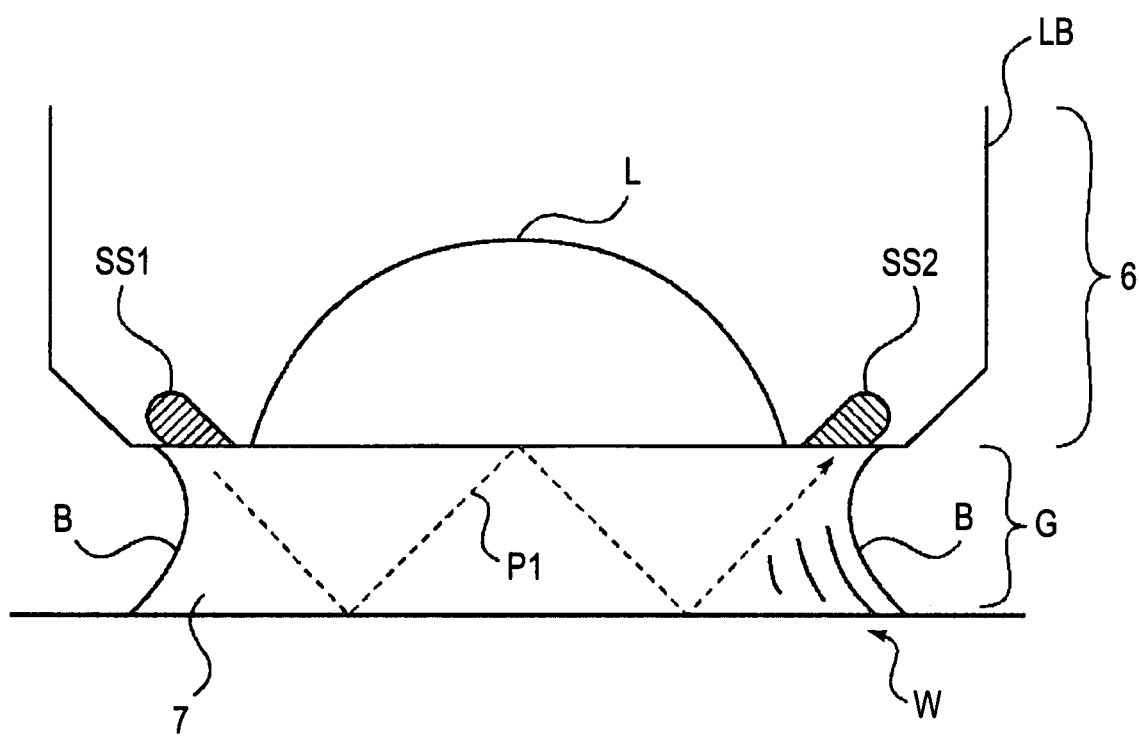
FIG. 2 is an enlarged view of a portion adjacent a termination end portion of a projection optical system, and it illustrates the state in which a liquid film is held.

FIG. 2 is an enlarged view of a portion adjacent the projection optical system termination end portion of the liquid immersion type exposure apparatus shown in FIG. 1, and it illustrates the state in which a liquid film 7 is maintained appropriately. There are sensors SS1 and SS2 provided inside a barrel LB. Each of the sensors SS1 and SS2 comprises a light sending device and a light receiving device, and it is disposed in a space surrounded by the outer periphery of the liquid film, that is, the liquid film boundary B. Light projected from the sensor SS1 (SS2) advances while being repeatedly reflected inside the liquid film 7, and it is received by another sensor, different from the sensor from which it is projected. In this example, the light sending device may comprise an LED, and the light receiving device may comprise a phototransistor.

Denoted at P1 is an example of light path for the light projected from the sensor SS1 and received by the sensor SS2. This light has a wavelength different from the exposure light. The light advancing along the path P1 is attenuated during the course of advancement. One major factor for the attenuation is that, in addition to absorption within the liquid film 7, the light is transmitted without being reflected by the wafer W and the final lens L. The amount of reflection of light at the bottom face of the final lens L is variable with the combination of the refractive indices of the final lens L and the liquid film 7. Similarly, the amount of reflection of light at the wafer W is variable with the combination of the refractive indices of the liquid film 7 and a resist applied onto the wafer W.

Where the sensors SS1 and SS2 are arranged to have the same light sending characteristic and light receiving characteristic, the intensity of light sent from the sensor SS1 and received by the sensor SS2 and the intensity of light sent from the sensor SS2 and received by the sensor SS1 can be detected as approximately the same value.

Further, measurement through the sensors SS1 and SS2 may be carried out beforehand prior to formation of the liquid film 7 and, in that occasion, the amount of light reception in the state that light is incident on the wafer W or the final lens L from the air without attenuation by the liquid medium, can be detected. Thus, in that case, reference information for detecting a change in the amount of light reception due to the formation of the liquid film 7 is obtainable. If in that case there is a difference between the amounts of light detected by the sensors SS1 and SS2, such difference can be regarded as an error, and a correction value can therefore be determined. Taking into account the possibility that the surface state of the wafer W is different between processes, the aforementioned measurement may preferably be performed with respect to every lot or every time the wafer is replaced. As a matter of course, if the surface state is different between shots on the wafer, it may be changed for every shot.

Alternatively, similar measurement using the sensors SS1 and SS2 as described above may be performed, on condition that complete formation of the liquid film 7 is confirmed beforehand in accordance with a method different from the present invention. In that occasion, reference information for detecting a change in the amount of light reception resulting from occurrence of incompleteness of the liquid film 7, is obtainable. Since such measurement can not be performed with respect to every wafer or every lot, preferably the measurement may be done by using a representative wafer to be used.

For effective utilization of light energy, the light to be projected from the sensors SS1 and SS2 should have a sufficient directivity. If, however, many sensors are provided inside the barrel and each is arranged to receive light from the others, a strong directivity characteristic is not necessary.

The foregoing description applies to a case where the liquid film 7 is maintained regularly. Here, the words "the liquid film is maintained regularly" refer to a state that the region in which the liquid film is formed covers at least the exposure region on the wafer.

Figure 3:
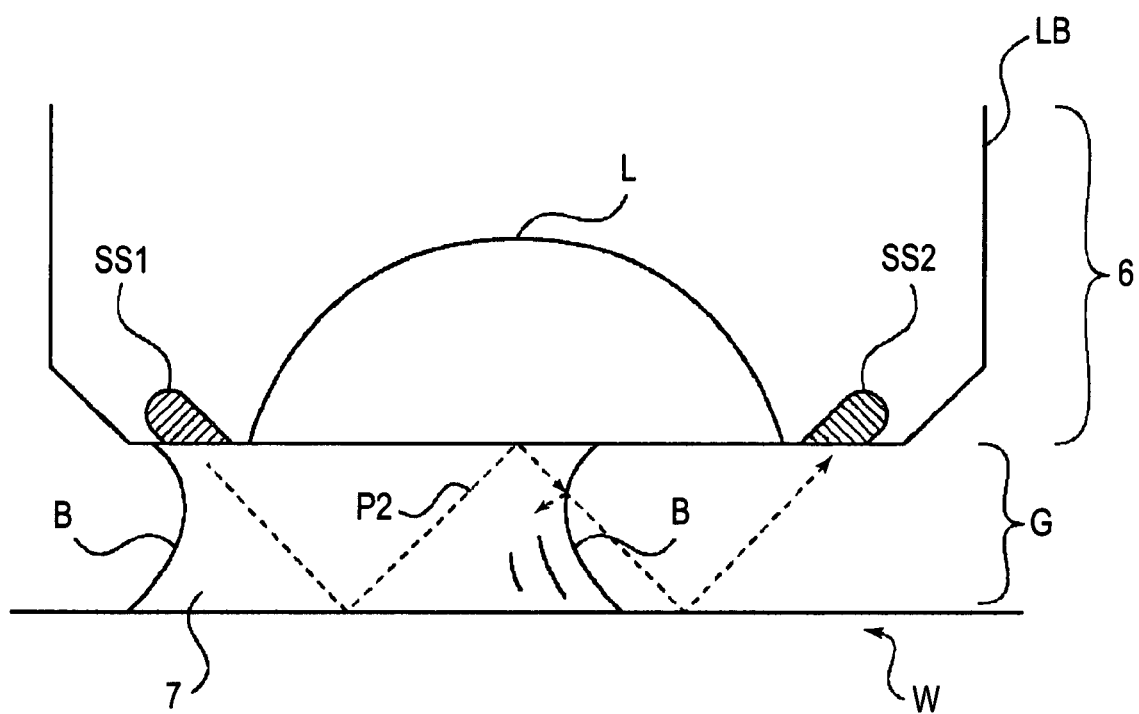
FIG. 3 is an enlarged view of a portion adjacent a termination end portion of a projection optical system, and it illustrates the state in which a portion of a liquid film has been disappeared.

FIG. 3 shows a similar portion as of FIG. 2, and it illustrates a state that the right-hand side portion of the liquid film 7 has been disappeared. Denoted at P2 is an example of light path for the light projected from the sensor SS1 and received by the sensor SS2, in this state. In this case, since a portion of the light sent from the sensor SS2 is reflected by the right-hand side of the liquid film boundary B, as compared with a case where the liquid film 7 is maintained regularly, the intensity of light received by the sensor SS2 changes. As regards additional factors that may cause a change in intensity of light to be received by the sensor SS2, one is that, between an air and a liquid, the amount of absorption of light is different; another is that, between in an air and in a liquid, the amount of reflection at the final lens L is different; and another is that, between in an air and in a liquid, the amount of reflection at the wafer W is different. Taking into account the information described above in appropriate combination, the distance through which the light has advanced inside the liquid can be estimated.

Further, the amount of transmission of light is different between a case where the light passes the right-hand side of the liquid film boundary B along the light path P2 and a case where the light passes in an opposite direction. Such asymmetry of the light intensity in dependence upon the direction of the light path, as described above, results from a phenomenon that, through the incidence angle, a portion of light passing from the liquid side to the air side is totally reflected. For this reason, the intensity of light sent from the sensor SS1 and received by the sensor SS2 does not become equal to the intensity of light sent from the sensor SS2 and received by the sensor SS1, inversely. Therefore, it is possible to discriminate whether the disappearance of the liquid film has occurred at the right-hand side or the left-hand side.

By using two sets of light sending devices and light receiving devices in combination as described above, presence/absence of the liquid film, disappearance of a portion of the liquid film, and the position where the liquid film disappearance has occurred, all can be estimated. As regards the combination of light sending device and light receiving device, more than two sets may be used. If a larger number of sets are used, the presence of the liquid film can be confirmed with a higher precision.

In a step-and-repeat type exposure apparatus, if disappearance of a liquid film is detected, the shot or shots being exposed when the disappearance is detected may be concluded as being ineffective. The conclusion may be stored into the memory MEM, and it may be signaled to the host computer later.

Similarly, in a step-and-scan type exposure apparatus, if disappearance of a liquid film is detected during exposure light irradiation, the shot or shots being exposed when the disappearance may be regarded as being a failure shot not having been exposed effectively. However, if a region inside that shot which region has already been exposed corresponds to the liquid film disappearance position, it may be concluded as being effective exposure, rather than regarding the same ineffective. This is because disappearance of the liquid film after the exposure does not have an influence upon the exposure.

In FIGS. 2 and 3, each of the sensors SS1 and SS2 has a light sending device and a light receiving device. However, the gap G between the wafer W and the termination end portion 6 of the projection optical system should be reduced to a level of 0.1 mm or less. Since it takes a cost to construct a light sending device capable of introducing light into the liquid film 7, with the sensor structure such as described above, it is a possible alternative that the sensors SS1 and SS2 are structured by use of a light receiving device only, while laser light is projected substantially in a horizontal direction from the outside of the liquid film 7 (for example, from the projection optical system termination end portion 6 or the barrel adjacent to it), in place of using a light sending device.

Referring now to FIGS. 1 and 3, a liquid film recovering operation to be performed in response to detection of partial disappearance of the liquid film, through the controller C, will be described.

As described hereinbefore, the liquid medium that forms the liquid film 7 is supplied only from the nozzle at the lower-end edge portion of the projection optical system termination end portion 6. Therefore, when a portion of the liquid film 7 disappears during movement of the wafer W and if the wafer W motion is continued still in that state, there is a possibility that the disappeared portion of the liquid film expands undesirably. Therefore, once disappearance of a portion of the liquid film 7 is detected, recovery of the liquid film should be conducted promptly.

It is now assumed that disappearance of liquid film such as illustrate in FIG. 3 occurred during motion of the wafer W, and that such disappearance is detected in the manner as described hereinbefore.

Promptly, in response to a signal from the controller C, the X-Y stage SYS and the Z state ZS are stopped and, simultaneously, liquid discharging and liquid suction through the nozzles 5a and 5b are discontinued.

Thereafter, the nozzle 5 is operated to discharge a liquid therefrom, while on the other hand the X-Y stage XYS is driven to move the wafer W rightwardly. During this motion, the sensors SS1 and SS1 are kept operated.

If complete recovery of the liquid film 7 is confirmed, drive of the X-Y stage XYS and liquid discharging of the nozzle 5a are discontinued, and regular operation is restored.

While restoration from the partial liquid film disappearance has been described above, now measures to be taken when liquid film disappearance in a wide area is detected or in a case where liquid film disappearance is detected again regardless of execution of the liquid film recovery operation, will be explained. Anyway, in these occasions, the liquid film formation should be started over.

Here, in order to perform the following operation, the liquid film detection through the sensors 5a and 5b should be made effective to a large gap wider than that during regular exposure operation. To this end, with respect to such gap, measurement similar to that in the acquisition of reference information as described hereinbefore should be done beforehand.

First of all, like that described above, in response to a signal from the controller C, the X-Y stage XYS and the Z stage ZS are stopped promptly and, simultaneously, liquid discharging and liquid suction through the nozzles 5a and 5b are discontinued. Subsequently, the Z stage ZS is moved downwardly so as to expand the gap G to about 0.5 mm. The motion for expanding the gap G is to ensure that the liquid film is formed slowly. However, if there remains a large portion of the liquid film 7, the X-Y stage XYS may be driven to once completely retract the wafer W from the projection optical system termination end portion 6 and, after that, the Z stage ZS may be driven to a position sufficient to expand the gap G to about 0.5 mm, and the X-Y stage XYS may be moved again back to its original position.

Subsequently, one nozzle, that is, the nozzle 5a, for example, is operated to discharge a liquid, while on the other hand the wafer W is moved slowly in a direction opposite to the nozzle being in discharge operation, that is, rightwardly in this example. Here, the sensors SS1 and SS2 are kept in operation, and if complete formation of the liquid film 7 is discriminated, the motion of the wafer W and the liquid discharging through the nozzle 5a are discontinued. After this, while all the nozzles (nozzles 5a and 5b in this example) are operated to suck up the liquid, the Z stage ZS is driven to reduce the gap to about 0.1 mm, and regular operation is restored.

Although an embodiment using two nozzles has been described with reference to FIG. 1, as a matter of course, more than two nozzles may be used. In that occasion, for start-over of liquid film formation, adjoining plural nozzles may be used to discharge the liquid.

Further, the liquid discharging rate may be changed with time, and in that occasion, the liquid film can be formed uniformly without bubbles remaining in the liquid film.

Furthermore, when the wafer W is moved simultaneously with the liquid discharge, the movement speed may be changed with time, or alternatively, the wafer may be moved in Z or Y direction, irrelevant to the required movement direction, or oscillated in a rotational direction, and through such motion, uniform liquid film formation can be facilitated.

Next, another embodiment concerning the liquid film detection using a large number of sensors, will be explained.

Figure 4:
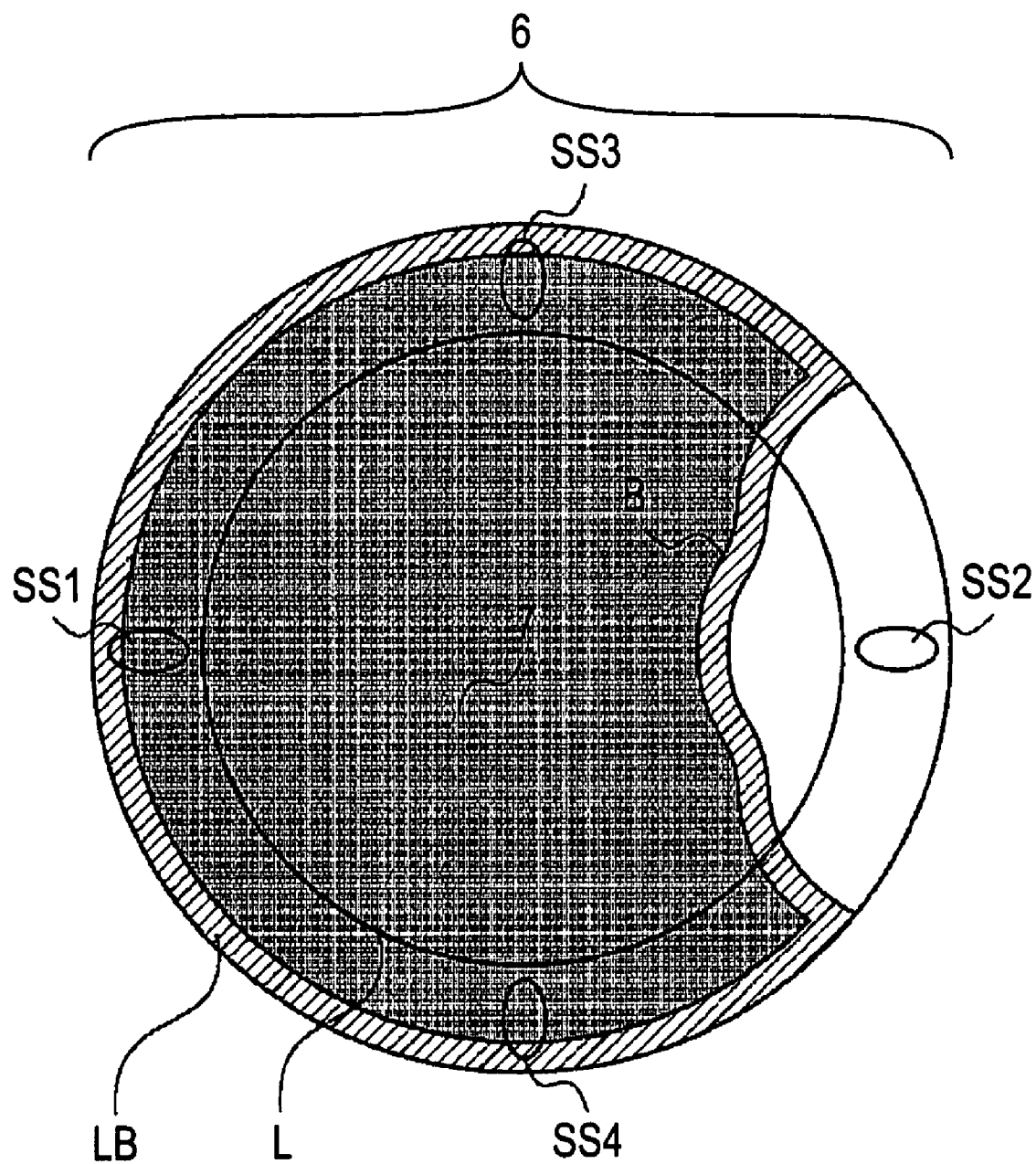
FIG. 4 is a view of a portion adjacent a termination end portion of a projection optical system, as seen from the above, and it illustrates the state in which a portion of a liquid film has been disappeared.

FIG. 4 is a view of a portion near the projection optical system termination end portion 6, as seen from the above, and it illustrates a state in which a portion of the liquid film 7 has been disappeared. Sensors SS1 and SS2 have a function as described hereinbefore, and there are additional sensors SS3 and SS4 which operate similarly to these sensors. The four sensors shown in FIG. 4 all have a function for sending and receiving light. These sensors can be operated at different timings, through the controller C.

In the case of FIG. 4, only a portion of the liquid film 7 around the sensor SS2 has been disappeared. Therefore, in the vicinity of the sensor SS2, the liquid film boundary B has invaded into the lens L side.

First of all, the sensor SS1 is caused to send light, and all the other sensors receive light simultaneously or sequentially to detect the light from the sensor SS1. Subsequently and similarly, the sensor SS2 is caused to send light, and all the other sensors receive light. In this manner, through all combinations of the sensors, light sending and light reception are carried out. Then, it can be detected that, only in relation to the light sending and light reception made through the sensor SS2, the detected light quantity differs largely from the level as the liquid film 7 is maintained appropriately. Thus, in this manner, the controller C can discriminate that the liquid film has disappeared in a portion adjacent the sensor SS2.

Figure 5:
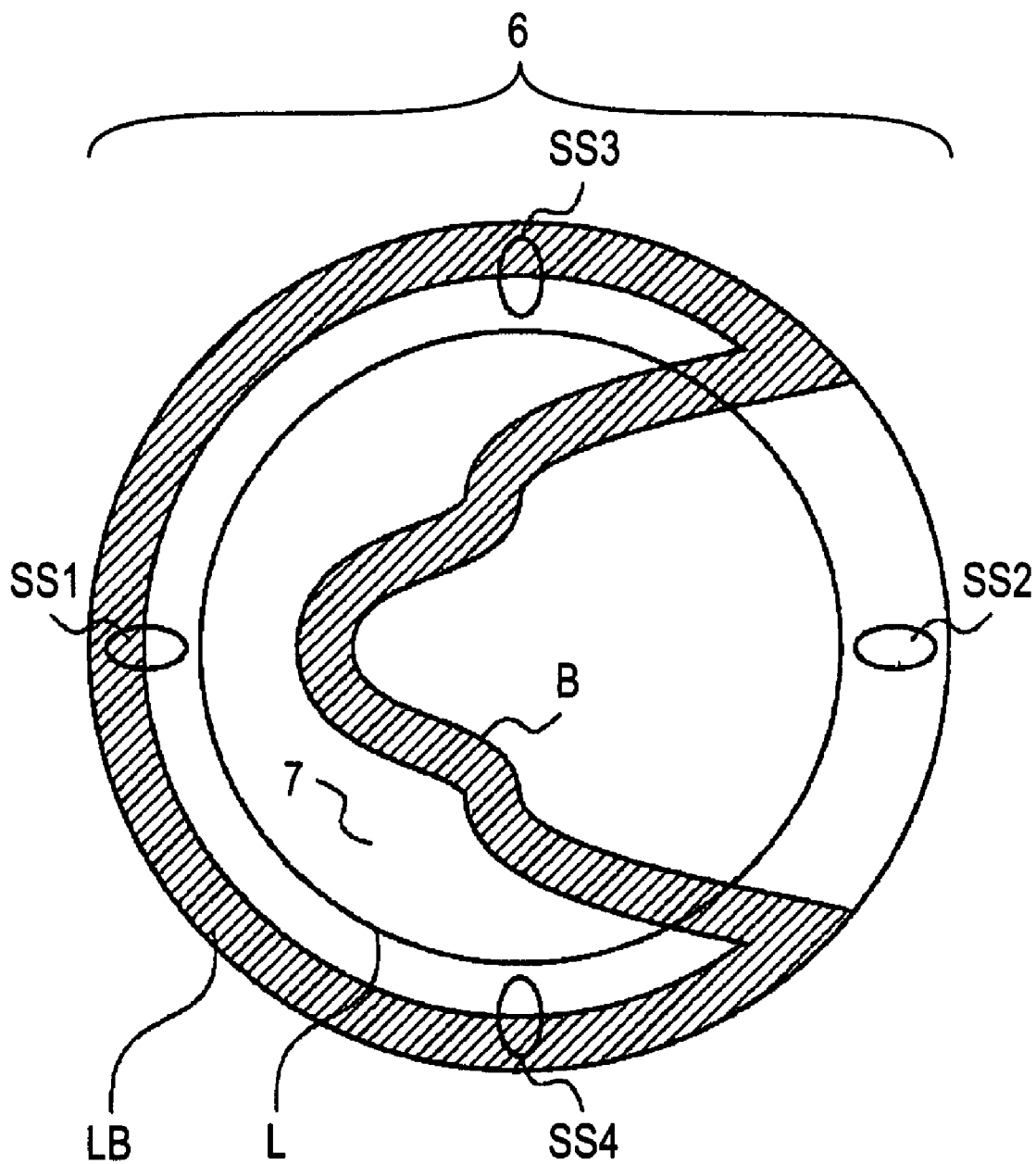
FIG. 5 is a view of a portion adjacent a termination end portion of a projection optical system, as seen from the above, and it illustrates the state in which a large portion of a liquid film has been disappeared.

Next, a case where the disappearance of the liquid film 7 has been expanded largely will be explained with reference to FIG. 5.

Like the example described with reference to FIG. 4, the light sending and light reception operations are carried out through all combinations of the sensors. As a result, in this example, in regard to the light sending and light reception between the sensors SS1 and SS3 and the light sending and light reception between the sensors SS1 and SS4, the detected light quantity increases slightly as compared with a case where the liquid film 7 is maintained appropriately. This is because of the influence of light reflection at the liquid film boundary B. However, as regards the light sending and light reception through the other sensors, the detected light quantity changes notably. Therefore, it can be concluded that disappearance of liquid film 7 has occurred not only in a portion adjacent the sensor SS2 but also in a portion nearing the center of the final lens L.

It should be noted here that, in this embodiment, where F2 laser having a wavelength of about 157 nm, for example, is used as a light source, regarding the liquid medium, a fluorine series inactive liquid, that is, a safe liquid being chemically stable and having a high transmissivity to exposure light, may be used.

Next, referring to FIGS. 6 and 7, an embodiment of a device manufacturing method which uses an exposure apparatus described above, will be explained.

Figure 6:
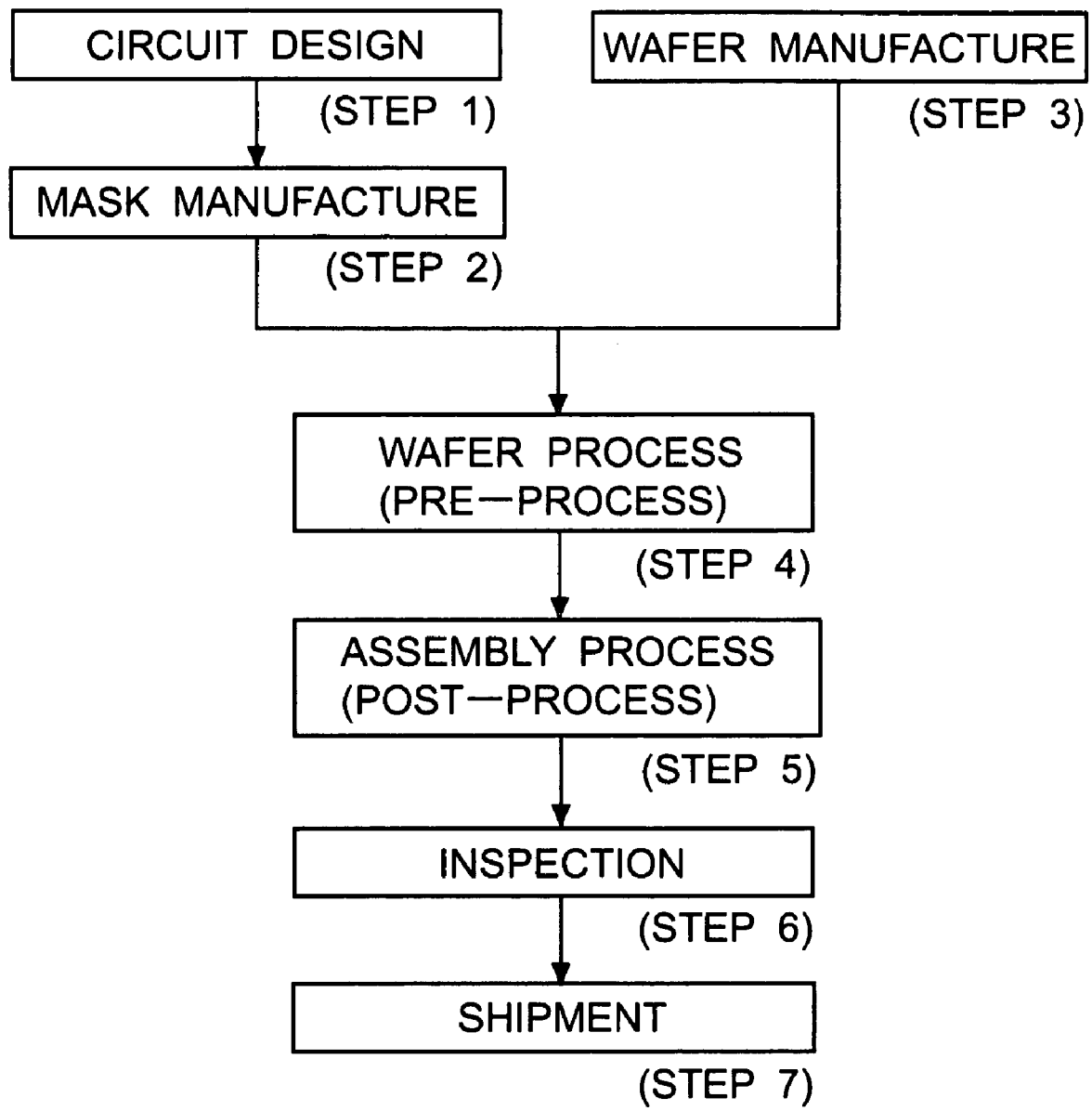
FIG. 6 is a flow chart for explaining device manufacturing processes.

FIG. 6 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon, for example. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 7:
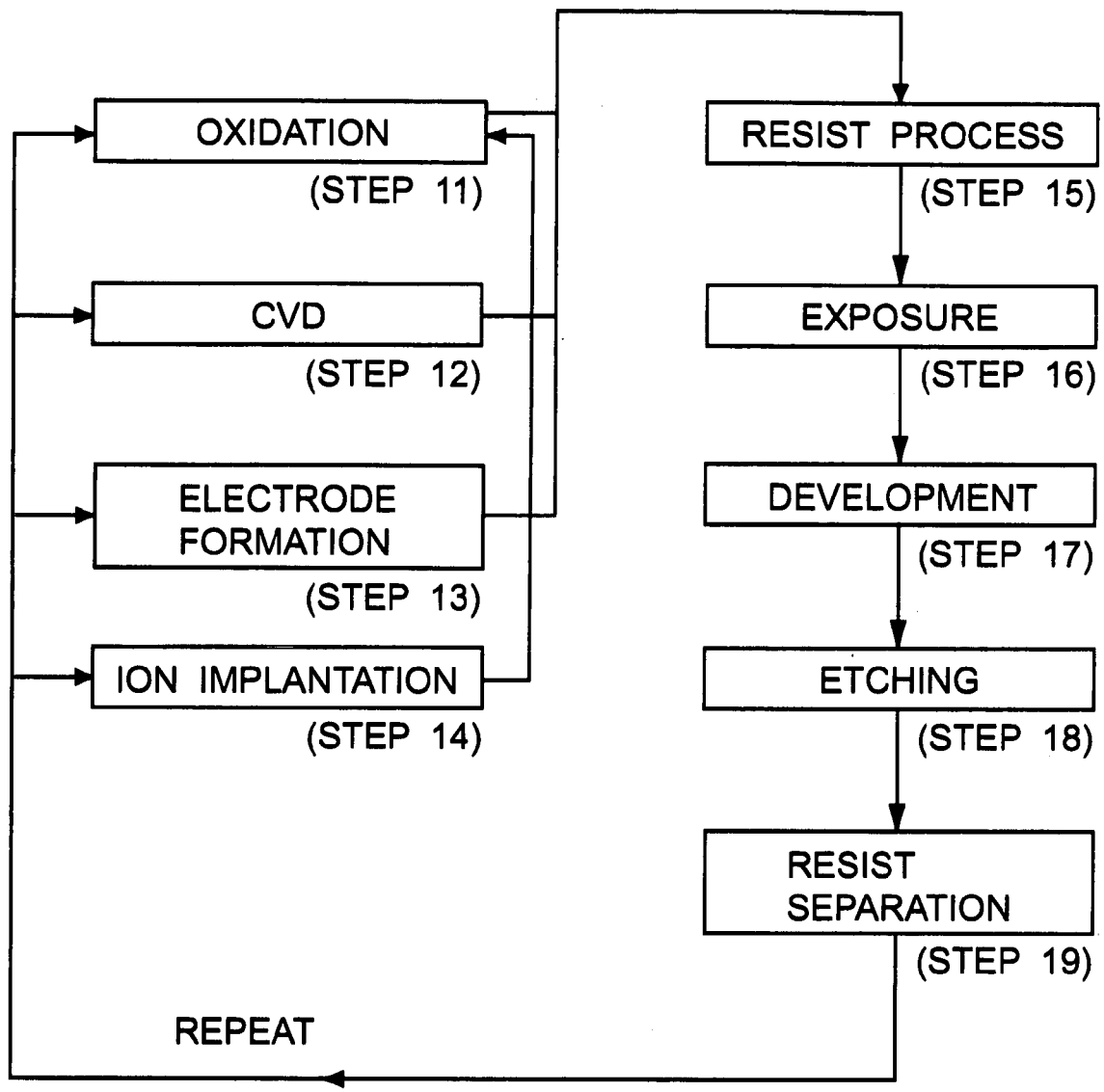
FIG. 7 is a flow chart for explaining details of a wafer process in the procedure of FIG. 6.

FIG. 7 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

The entire disclosure of Japanese Patent Application No. 2003-181261 filed in Japan on Jun. 25, 2003, including the claims, specification, drawings and abstract, is incorporated herein by reference in its entirety.

While the invention has been described with reference to the structures disclosed herein, it is not confined to the details set forth and this application is intended to cover such modifications or changes as may come within the purposes of the improvements or the scope of the following claims.

What is claimed is:

1. A liquid immersion type exposure apparatus, comprising:
    a projection optical system for projecting a pattern of a mask onto a substrate;
    a liquid film forming system for forming a liquid film in a predetermined region between said projection optical system and the substrate; and
    a sensor for detecting disappearance of at least a portion of the liquid film in said predetermined region, said sensor having a light providing element and a light receiving element mounted on a barrel of said projection optical system, wherein light from said light providing element is received by said light receiving element after being repeatedly reflected inside the liquid film.

2. An apparatus according to claim 1, further comprising a controller for estimating the position where the disappearance of liquid film has occurred, on the basis of the detection by said sensor.

3. An apparatus according to claim 2, wherein said controller is operable to discriminate whether exposures having been made to shot regions of the substrate are effective or not, on the basis of the result of estimation.

4. An apparatus according to claim 2, wherein said controller is operable to perform a process for recovering the liquid film, on the basis of the result of estimation.

5. An apparatus according to claim 1, wherein at least a portion of said sensor is disposed in a region being filled with the liquid film.

6. An apparatus according to claim 1, wherein said predetermined region includes an exposure region of the substrate.

7. A device manufacturing method, comprising the steps of: exposing a substrate by use of an exposure apparatus as recited in claim 1; and developing the exposed substrate.

* * * * *